United States Patent
Chen

(10) Patent No.: US 9,280,024 B2
(45) Date of Patent: Mar. 8, 2016

(54) PIXEL STRUCTURE

(71) Applicant: Au Optronics Corporation, Hsinchu (TW)

(72) Inventor: Yan-Liang Chen, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/467,056

(22) Filed: Aug. 25, 2014

(65) Prior Publication Data

US 2015/0097191 A1 Apr. 9, 2015

(30) Foreign Application Priority Data

Oct. 7, 2013 (TW) .............................. 102136238 U

(51) Int. Cl.
*G02F 1/1343* (2006.01)
*H01L 27/32* (2006.01)
*G02F 1/1362* (2006.01)
*H01L 51/52* (2006.01)
*G02F 1/1335* (2006.01)

(52) U.S. Cl.
CPC ...... *G02F 1/13439* (2013.01); *G02F 1/133553* (2013.01); *H01L 27/3244* (2013.01); *H01L 51/5209* (2013.01); *H01L 51/5218* (2013.01); *H01L 51/5271* (2013.01); *G02F 1/136227* (2013.01)

(58) Field of Classification Search
CPC ................... G02F 1/136286; G02F 1/136227; G02F 1/13439; G02F 1/33553; H01L 27/124; H01L 27/3276; H01L 27/3244; H01L 51/5209; H01L 51/5218; H01L 51/5271
See application file for complete search history.

(56) References Cited

U.S. PATENT DOCUMENTS

| 2005/0083456 | A1 | 4/2005 | Yoshii | |
|---|---|---|---|---|
| 2009/0180066 | A1* | 7/2009 | Tung et al. | 349/114 |
| 2010/0112737 | A1* | 5/2010 | Chen et al. | 438/30 |

FOREIGN PATENT DOCUMENTS

| CN | 1501099 | 6/2004 |
|---|---|---|
| CN | 1603908 | 4/2005 |
| CN | 102187263 | 9/2011 |

* cited by examiner

*Primary Examiner* — Whitney T Moore
(74) *Attorney, Agent, or Firm* — Jianq Chyun IP Office

(57) ABSTRACT

A pixel structure is provided. The pixel structure includes a scan line, a data line, an active device, a covering layer, and a reflective pixel electrode. The active device is electrically connected with the scan line and the data line. The covering layer covers the scan line, the data line, and the active device. The reflective pixel electrode is disposed on the covering layer, and electrically connected with the active device. The reflective pixel electrode includes a first region having a plurality of first protruding structures and a second region having a planar surface. The area occupied by the first region is 50% to 70% of the total area of the reflective pixel electrode, and the area occupied by the second region is 30% to 50% of the total area of the reflective pixel electrode.

11 Claims, 9 Drawing Sheets

//]: #

PIXEL STRUCTURE

CROSS-REFERENCE TO RELATED APPLICATION

This application claims the priority benefit of Taiwan application serial no. 102136238, filed on Oct. 7, 2013. The entirety of the above-mentioned patent application is hereby incorporated by reference herein and made a part of this specification.

BACKGROUND OF THE INVENTION

1. Field of the Invention

The invention relates to a pixel structure. More particularly, the invention relates to a pixel structure with total internal reflection.

2. Description of Related Art

In recent years, with the development in optoelectronic technology and semiconductor manufacturing technology, flat panel displays have flourished as a result. Liquid crystal displays, characterized by advantages such as low operating voltage, free of harmful radiation, light weight, and compact size, have replaced conventional cathode ray tube displays and have become mainstream display products. However, the issue of limited viewing angle still remains for the liquid crystal display. Therefore, the development of a liquid crystal display with better display and wider viewing angle is one of the desired goals of developers.

SUMMARY OF THE INVENTION

The invention provides a pixel structure. The pixel structure has better reflectance and reflection angle distribution.

The invention provides a pixel structure. The pixel structure includes a scan line, a data line, an active device, a covering layer, and a reflective pixel electrode. The active device is electrically connected with the scan line and the data line. The covering layer covers the scan line, the data line, and the active device. The reflective pixel electrode is disposed on the covering layer, and electrically connected with the active device. The reflective pixel electrode includes a first region having a plurality of first protruding structures and a second region having a planar surface. The area occupied by the first region is 50% to 70% of the total area of the reflective pixel electrode, and the area occupied by the second region is 30% to 50% of the total area of the reflective pixel electrode.

The invention further provides a pixel structure. The pixel structure includes a scan line, a data line, an active device, a covering layer, and a reflective pixel electrode. The active device is electrically connected with the scan line and the data line. The covering layer covers the scan line, the data line, and the active device. The reflective pixel electrode is disposed on the covering layer, and electrically connected with the active device. The reflective pixel electrode includes a first region and a second region. The first region includes a plurality of first protruding structures and the second region includes a plurality of second protruding structures. Moreover, the height of each of the first protruding structures in the first region is greater than the height of each of the second protruding structures in the second region. In particular, the area occupied by the first region is 50% to 70% of the total area of the reflective pixel electrode and the area occupied by the second region is 30% to 50% of the total area of the reflective pixel electrode.

Based on the above, in the pixel structure provided by the invention, a reflective pixel electrode includes a first region having a protruding structure and a second region having a planar surface. Alternately, the reflective pixel electrode includes a first region and a second region respectively having a plurality of protruding structures. In particular, the height of each of the protruding structures in the first region is greater than the height of each of the protruding structures in the second region, the area occupied by the first region is 50% to 70% of the total area of the reflective pixel electrode, and the area occupied by the second region is 30% to 50% of the total area of the reflective pixel electrode. As a result, the pixel structure of the invention can increase light reflectance and increase reflection angle distribution of light.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
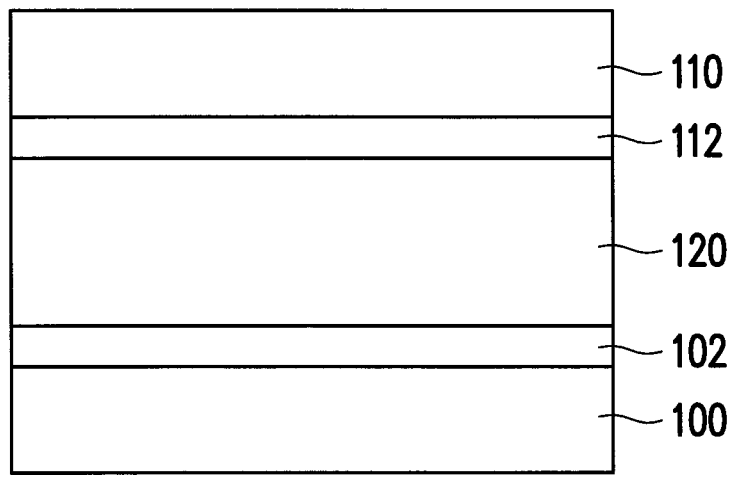
FIG. 1 is a schematic cross-sectional diagram of a display panel according to an embodiment of the invention.

FIG. 1 is a schematic cross-sectional diagram of a display panel according to an embodiment of the invention.

Referring to FIG. 1, the display panel of the present embodiment includes a first substrate 100, a second substrate 110, and a display medium 120 disposed between the first substrate 100 and the second substrate 110.

The first substrate 100 is disposed opposite to the second substrate 110. The material of each of the first substrate 100 and the second substrate 110 can be glass, quartz, an organic polymer, or other suitable materials. The display medium 120 is, for instance, a liquid crystal material. In other words, the display panel of the present embodiment is, for instance, a liquid crystal display panel. However, the invention is not limited thereto. In other embodiments, the display medium 120 can also be other display materials such as an organic light-emitting diode material, an inorganic light-emitting diode material, an electrophoretic display material, a fluorescent material, a phosphorescent material, or a plasma material.

A pixel array layer 102 is disposed on the first substrate 100. The pixel array layer 102 is formed by a plurality of pixel structures, and the design of each of the pixel structures is described in detail later with reference to FIG. 2 to FIG. 9. A color filter array layer 112 is disposed on the second substrate 110. The color filter array layer 112 includes a red filter pattern, a green filter pattern, or a blue filter pattern.

Moreover, the display panel of the invention can be any display panel known to those having ordinary skill in the art, and can therefore further include other desired components such as an electrode layer or a shielding pattern.

Figure 2:
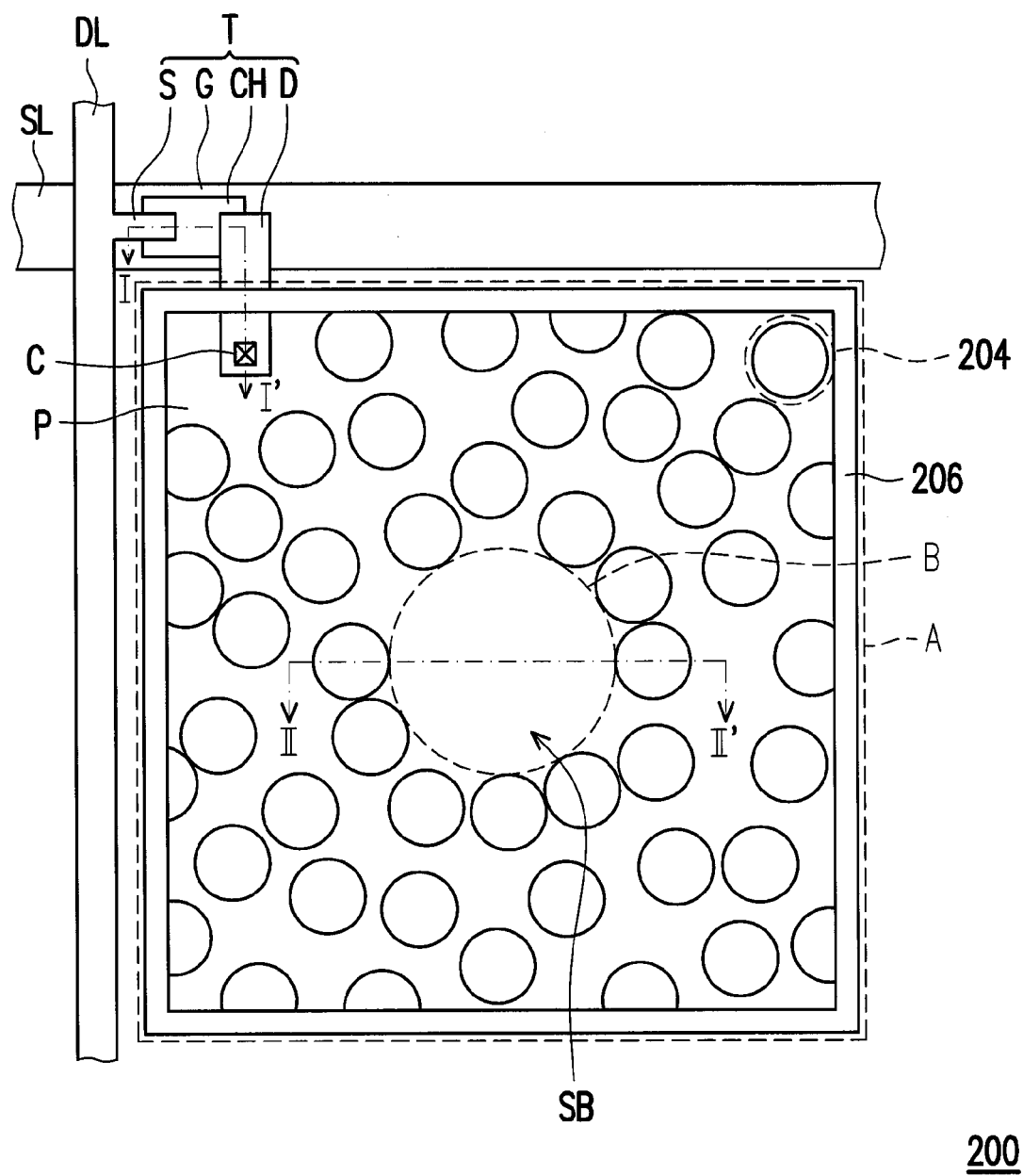
FIG. 2 is a schematic top view of a pixel structure according to an embodiment of the invention.
Figure 3:
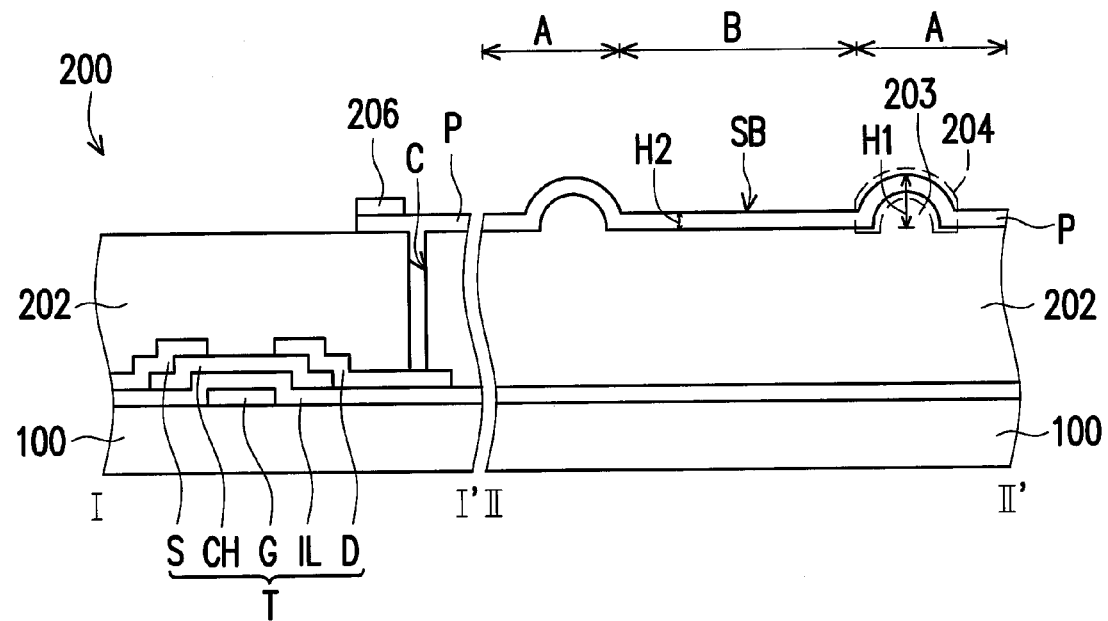
FIG. 3 is a schematic cross-sectional diagram along the lines I-I' and II-II' of FIG. 2.
Figure 4:
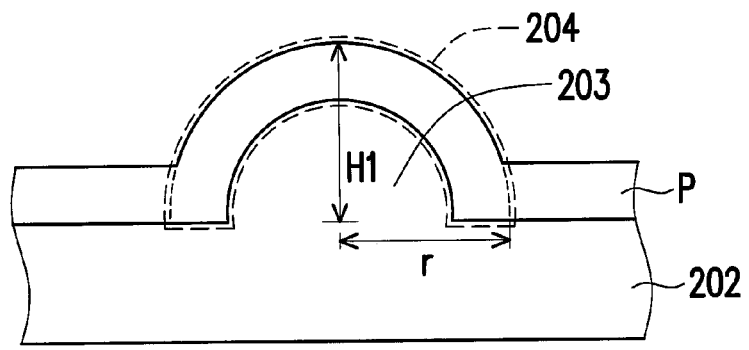
FIG. 4 is a partially enlarged schematic diagram of FIG. 3.

In the following, the pixel array layer 102 on the first substrate 100 is described in detail. Based on the above, the pixel array layer 102 is formed by a plurality of pixel structures. In an embodiment, the design of each of the pixel structures is as shown in FIG. 2. FIG. 2 is a schematic top view of a pixel structure according to an embodiment of the invention. FIG. 3 is a schematic cross-sectional diagram along the lines I-I' and II-II' of FIG. 2.

Referring to both FIG. 2 and FIG. 3, a pixel structure 200 of the present embodiment includes a scan line SL, a data line DL, an active device T, a covering layer 202, and a reflective pixel electrode P.

In the present embodiment, the extending direction of the scan line SL is different from the extending direction of the data line DL. Preferably, the extending direction of the scan line SL is perpendicular to the extending direction of the data line DL. Moreover, the scan line SL and the data line DL are located in different film layers, and an insulating layer (not shown) is sandwiched between the two. The scan line SL and the data line DL are mainly used to transmit a driving signal that drives the pixel structure 200. Each of the scan line SL and the data line DL generally includes a metal material. However, the invention is not limited thereto. According to other embodiments, the scan line SL and the data line DL can also use other conductive materials such as an alloy, metal oxide, metal nitride, metal oxynitride, or a stacked layer of a metal material and other conductive materials.

The active device T of the present embodiment is electrically connected with the scan line SL and the data line DL. Here, the active device T is, for instance, a thin-film transistor including a gate electrode G, a channel layer CH, a drain electrode D, and a source electrode S. The gate electrode G is electrically connected with the scan line SL and the source electrode S is electrically connected with the data line DL. In other words, when a control signal is input into the scan line SL, electrical conduction occurs between the scan line SL and the gate electrode G, and when a control signal is input into the data line DL, electrical conduction occurs between the data line DL and the source electrode S. The channel layer CH is located above the gate electrode G and below the drain electrode D and the source electrode S. The material of the gate electrode G is, for instance, a metal. The material of the channel layer CH can be a semiconductor material such as an amorphous silicon semiconductor material, a metal oxide semiconductor material, or an organic semiconductor material. The material of each of the source electrode S and the drain electrode D can be selected from a conductive material such as a metal, a transparent conductive material, or a metal alloy. The active device T of the present embodiment is exemplified as a bottom-gate thin-film transistor, but the invention is not limited thereto. In other embodiments, the active device T can also be a top-gate thin-film transistor.

Moreover, an insulating layer IL further covers the gate electrode G of the active device T. The insulating layer IL is also referred to as a gate insulating layer. The material of the insulating layer IL is, for instance, an inorganic material, an organic material, or a combination thereof. In particular, the inorganic material is, for instance, silicon oxide, silicon nitride, silicon oxynitride, or a stacked layer of at least two of the materials above.

The covering layer 202 of the present embodiment covers the scan line SL, the data line DL, and the active device T. The material of the covering layer 202 is, for instance, an inorganic material, an organic material, or a combination thereof. In particular, the inorganic material is, for instance, silicon oxide, silicon nitride, silicon oxynitride, or a stacked layer of at least two of the materials above. Moreover, as shown in FIG. 2, the top portion of the covering layer 202 includes a plurality of bumps 203. In other words, the covering layer 202 has an uneven surface. Here, the forming method of the covering layer 202 includes, for instance, using a lithography and etching process, a photolithography technique, or other suitable process methods. In particular, the lithography and etching process is, for instance, a half-tone mask (HTM) process or a gray mask (GM) process.

The reflective pixel electrode P of the present embodiment is disposed on the covering layer 202 and electrically connected with the active device T. Specifically, the reflective pixel electrode P is electrically connected with the drain electrode D of the active device T through a contact window C. The material of the reflective pixel electrode P is, for instance, a metal such as aluminum or titanium (Ti), and is preferably formed by a highly reflective conductive material.

Moreover, in the present embodiment, since a plurality of bumps 203 are formed on the top portion of the covering layer 202, when the reflective pixel electrode P is conformally disposed on the covering layer 202, the reflective pixel electrode P also has an uneven surface. Specifically, the reflective pixel electrode P includes a first region A and a second region B. The first region A includes a plurality of protruding structures 204, whereas the second region B has a planar surface SB, and the first region A surrounds the second region B. In the present embodiment, the area occupied by the first region A is 50% to 70% of the total area of the reflective pixel electrode P and the area occupied by the second region B is 30% to 50% of the total area of the reflective pixel electrode P.

Moreover, in the present embodiment, taking the lowest horizontal position of the top surface of the covering layer 202 as a base, a height H1 of each of the protruding structures 204 is substantially greater than a height H2 of the planar surface SB, and the height H1 of each of the protruding structures 204 is, for instance, between 1 μm and 2 μm. It should be mentioned that, in the case that the vertical projection area of each of the protruding structures 204 on the covering layer 202 is the same, a larger height H1 of the protruding structures 204 indicates a larger surface curvature of the protruding structures 204. Specifically, referring to FIG. 4, the relationship between the height H1 of the protruding structures 204 and surface curvature can satisfy the following formula 1 and formula 2:

$$R=(H^2+r^2)/2H \quad \text{formula 1}$$

$$C=1/R \quad \text{formula 2}$$

wherein, R is the radius of curvature of the surface of the protruding structures, H is the height of the protruding structures (i.e., height H1 in FIG. 4), r is half of the connecting line which connecting the two intersection points between the line extending from the surface of the protruding structures with the same curvature as the surface of the protruding structures and the surface of the covering layer (i.e., length r in FIG. 4), and C is the curvature. Specifically, in the case that r is set to 2.5 µm, when H is 1.86 µm, the radius of curvature R is calculated to be 2.6 µm through formula 1 and the curvature C is calculated to be 0.38 µm through formula 2. When H is 1.41 µm, the radius of curvature R is calculated to be 2.9 µm through formula 1 and the curvature C is calculated to be 0.34 µm through formula 2.

Figure 5A:
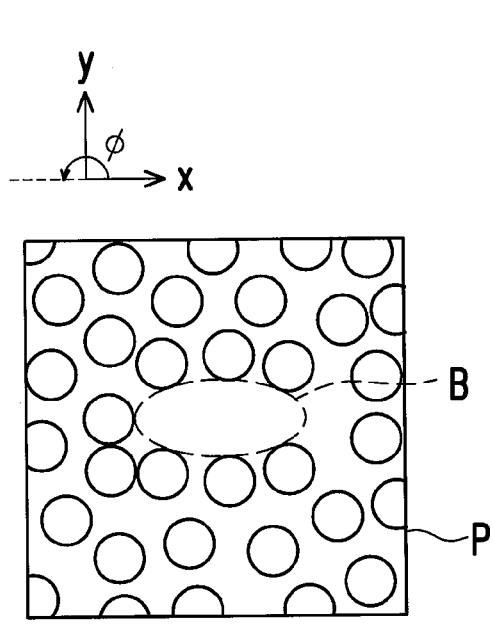
FIG. 5A to FIG. 5H are respectively a schematic top view of a reflective pixel electrode in a pixel structure according to an embodiment of the invention.
Figure 5B:
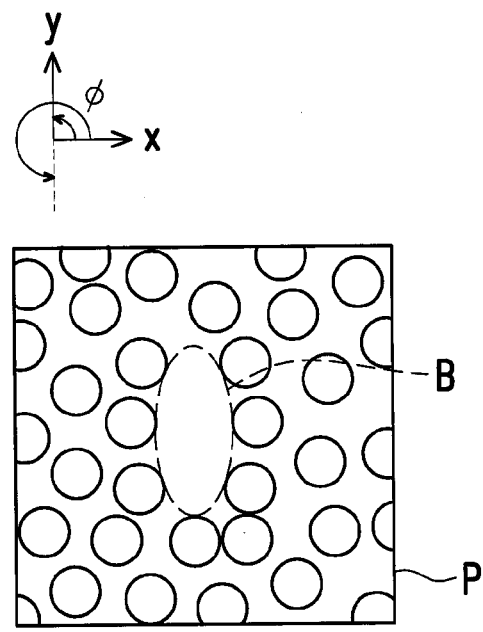
Figure 5C:
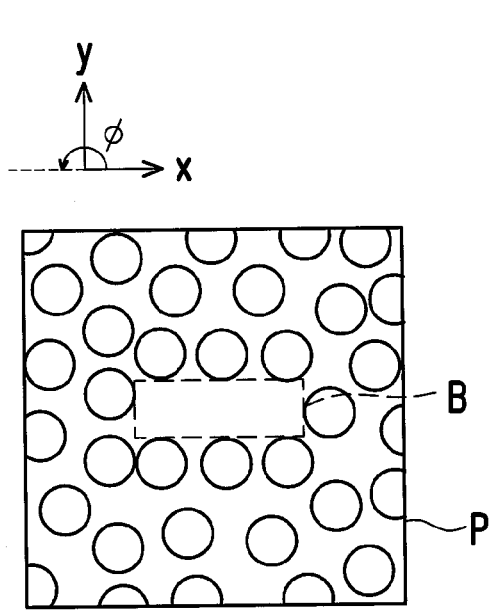
Figure 5D:
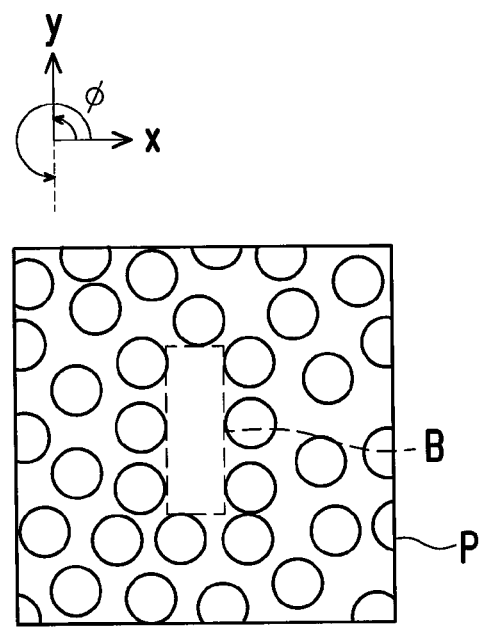
Figure 5E:
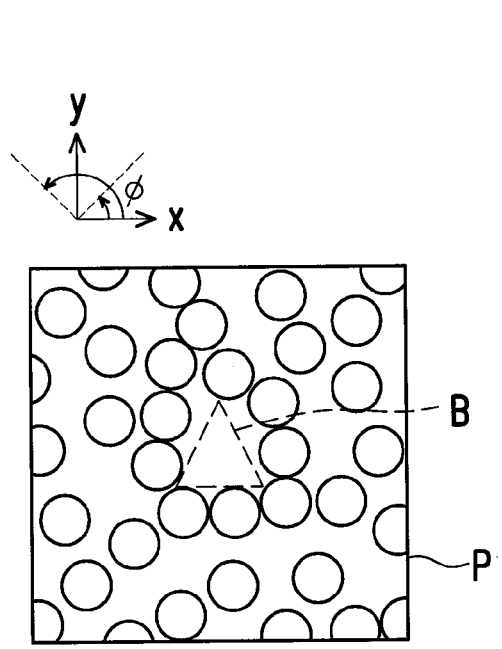
Figure 5F:
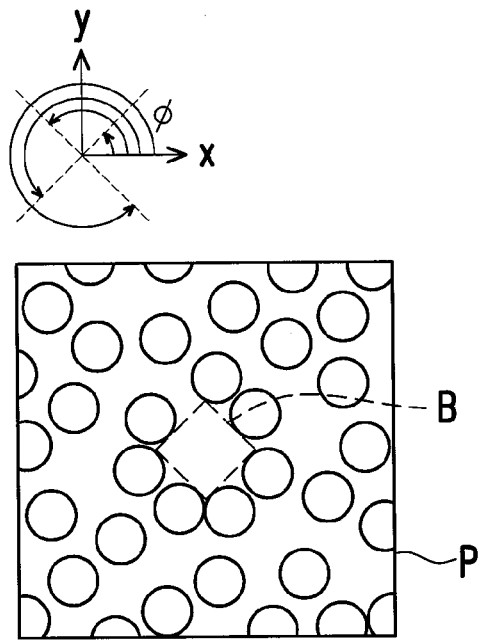
Figure 5G:
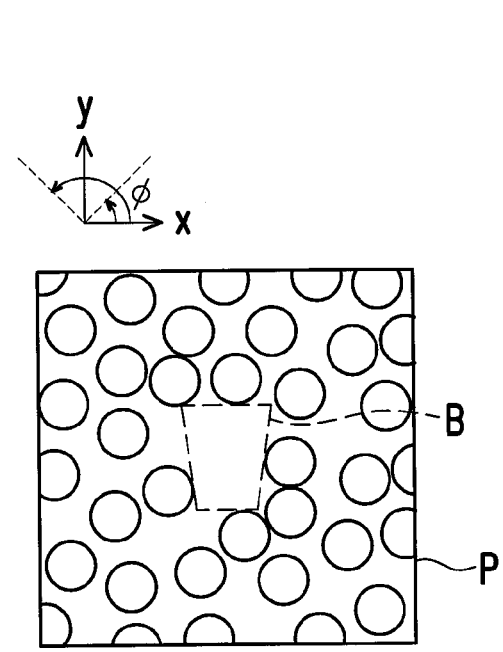
Figure 5H:
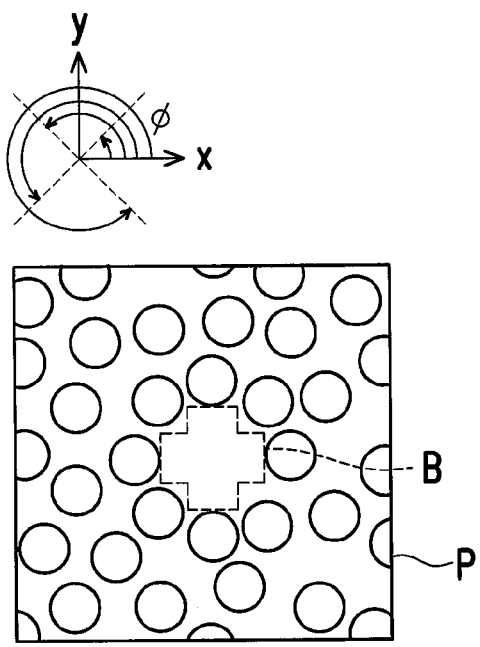

Moreover, although the shape of the second region B of the reflective pixel electrode P of the present embodiment is a circle (as shown in FIG. 2), the invention is not limited thereto. In other embodiments, based on the requirement of the viewing angle of the display panel, the shape of the second region B of the reflective pixel electrode P can also be an ellipse as shown in FIG. 5A and FIG. 5B, a rectangle as shown in FIG. 5C and FIG. 5D, a triangle as shown in FIG. 5E, a rhombus as shown in FIG. 5F, a trapezoid as shown in FIG. 5G, or a cross as shown in FIG. 5H. In this way, the reflective pixel electrode P can render higher light reflectance under a specific viewing angle, and as a result the display panel can render an image with higher resolution and contrast. Specifically, referring to both FIG. 5A and FIG. 5C, when the azimuth viewing angle φ of a viewer is 0 degrees and 180 degrees (i.e., horizontal viewing direction), the reflective pixel electrode P shown in FIG. 5A or FIG. 5C can render higher light reflectance. On the other hand, if the viewing direction of the viewer is not horizontal, then the reflective pixel electrode P shown in FIG. 5A or FIG. 5C renders worse light reflectance. Similarly, when the azimuth viewing angle φ of the viewer is 90 degrees and 270 degrees (i.e., perpendicular viewing direction), the reflective pixel electrode P shown in FIG. 5B or FIG. 5D can render higher light reflectance. When the azimuth viewing angle φ of the viewer is 45 degrees and 135 degrees (i.e., up, left and right 45 degree azimuth viewing direction), the reflective pixel electrode P shown in FIG. 5E or FIG. 5G can render higher light reflectance. When the azimuth viewing angle φ of the viewer is 45 degrees, 135 degrees, 225 degrees, and 315 degrees (i.e., up, down, left and right 45 degree azimuth viewing direction), the reflective pixel electrode P shown in FIG. 5F or FIG. 5H can render higher light reflectance.

Figure 6:
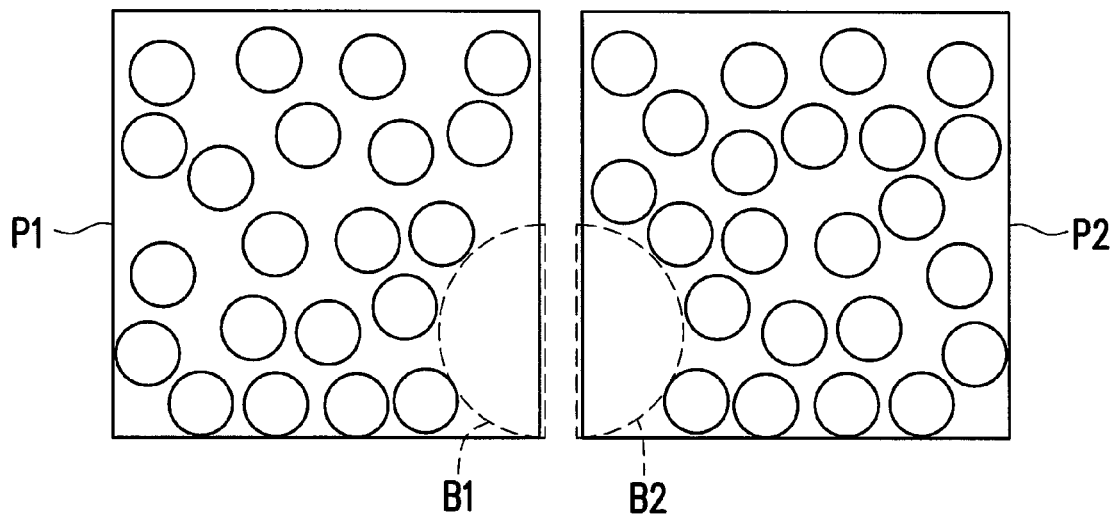
FIG. 6 is a schematic top view of a reflective pixel electrode in a pixel structure according to an embodiment of the invention.

Moreover, although the second region B in each of FIG. 2 and FIGS. 5A to 5H is shown to be located in the central region of the reflective pixel electrode P, the invention is not limited thereto. In other embodiments, the second region can also be located in any corner region of the reflective pixel electrode. For instance, referring to FIG. 6, in the present embodiment, a second region B1 of a reflective pixel electrode P1 is located in the lower right corner region of the reflective pixel electrode P1, and a second region B2 of a reflective pixel electrode P2 is located in the lower left corner region of the reflective pixel electrode P2. Specifically, the second region B1 of the reflective pixel electrode P1 and the second region B2 of the reflective pixel electrode P2 can form a specific shape together. In FIG. 6, the specific shape is a circle, but the invention is not limited thereto. In other embodiments, the specific shape can also be an ellipse, a rectangle, a triangle, a rhombus, a trapezoid, or a cross.

Moreover, in the present embodiment, the pixel structure 200 can further include a fixed layer 206. Specifically, the fixed layer 206 is disposed on the reflective pixel electrode P and surrounds the periphery of the reflective pixel electrode P to prevent the reflective pixel electrode P from peeling off from the covering layer 202. The material of the fixed layer 206 is, for instance, a metal oxide such as indium tin oxide, indium zinc oxide, aluminum tin oxide, aluminum zinc oxide, indium germanium zinc oxide, other suitable oxides, or a stacked layer of at least two of the oxides above.

An entirely planar surface of the reflective pixel electrode results in better light reflectance but is not ideal for the reflection angle distribution. On the other hand, when protruding structures are disposed on the entire reflective pixel electrode, the light reflectance is worse but the reflection angle distribution is good. Accordingly, in the pixel structure 200 of the embodiments, the first region A of the reflective pixel electrode P includes the protruding structures 204, the second region B has the planar surface SB, the area occupied by the first region A is 50% to 70% of the total area of the reflective pixel electrode P, and the area occupied by the second region B is 30% to 50% of the total area of the reflective pixel electrode P. Therefore, when light enters the reflective pixel electrode P, the pixel structure 200 can have better reflection efficiency and reflection angle distribution. In this way, the display panel of the invention can have better display quality and wider viewing angle.

Figure 7:
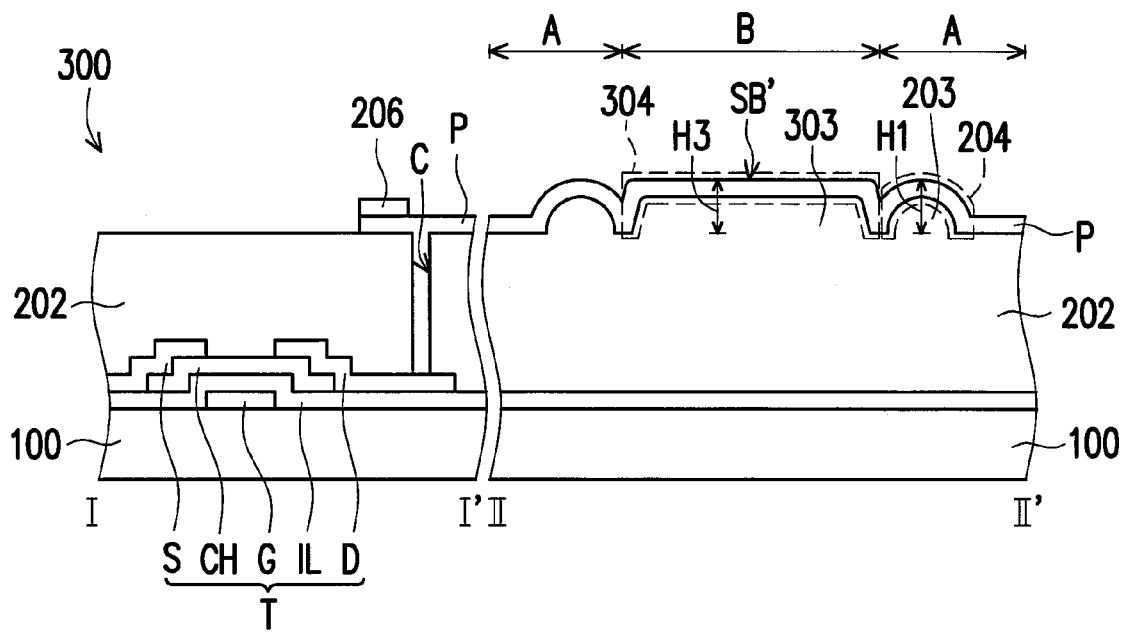
FIG. 7 is a schematic cross-sectional diagram of a pixel structure according to another embodiment of the invention.

FIG. 7 is a schematic cross-sectional diagram of a pixel structure according to another embodiment of the invention. The schematic top view of the pixel structure 300 of FIG. 7 is shown in FIG. 2. In particular, cross-sectional locations of FIG. 7 are shown at the locations of the lines I-I' and II-IF in FIG. 2. Moreover, the embodiment of FIG. 7 is similar to the embodiment of each of FIG. 2 and FIG. 3, and therefore the same components are represented by the same reference numerals and are not repeated herein.

Referring to both FIG. 7 and FIG. 3, differences between the pixel structure 300 of the present embodiment and the pixel structure 200 of FIG. 3 lie in that: the top portion of the covering layer 202 further includes a bump 303 in the second region B and the second region B of the reflective pixel electrode P also includes a protruding structure 304. Specifically, the top surface of the bump 303 is planar. As a result, when the reflective pixel electrode P is conformally disposed on the covering layer 202, the top surface of the protruding structure 304 of the reflective pixel electrode P is a planar surface SB'.

Moreover, in the present embodiment, taking the lowest horizontal position of the top surface of the covering layer 202 as a base, the height H1 of each of the protruding structures 204 is substantially equal to a height H3 of the protruding structure 304 (planar surface SB'). However, the invention is not limited thereto. In other embodiments, the height H1 of each of the protruding structures 204 can also be substantially greater than the height H3 of the planar surface SB'.

It can be known from the embodiment of FIG. 7 that, in the reflective pixel electrode P, the first region A includes the protruding structures 204, the second region B includes the protruding structure 304 (i.e., the top surface is the planar surface SB'), the area occupied by the first region A is 50% to 70% of the total area of the reflective pixel electrode P, and the area occupied by the second region B is 30% to 50% of the total area of the reflective pixel electrode P. Therefore, when light enters the reflective pixel electrode P, the pixel structure 300 can have better reflection efficiency and reflection angle distribution. In this way, the display panel of the invention can have better display quality and wider viewing angle.

Figure 8:
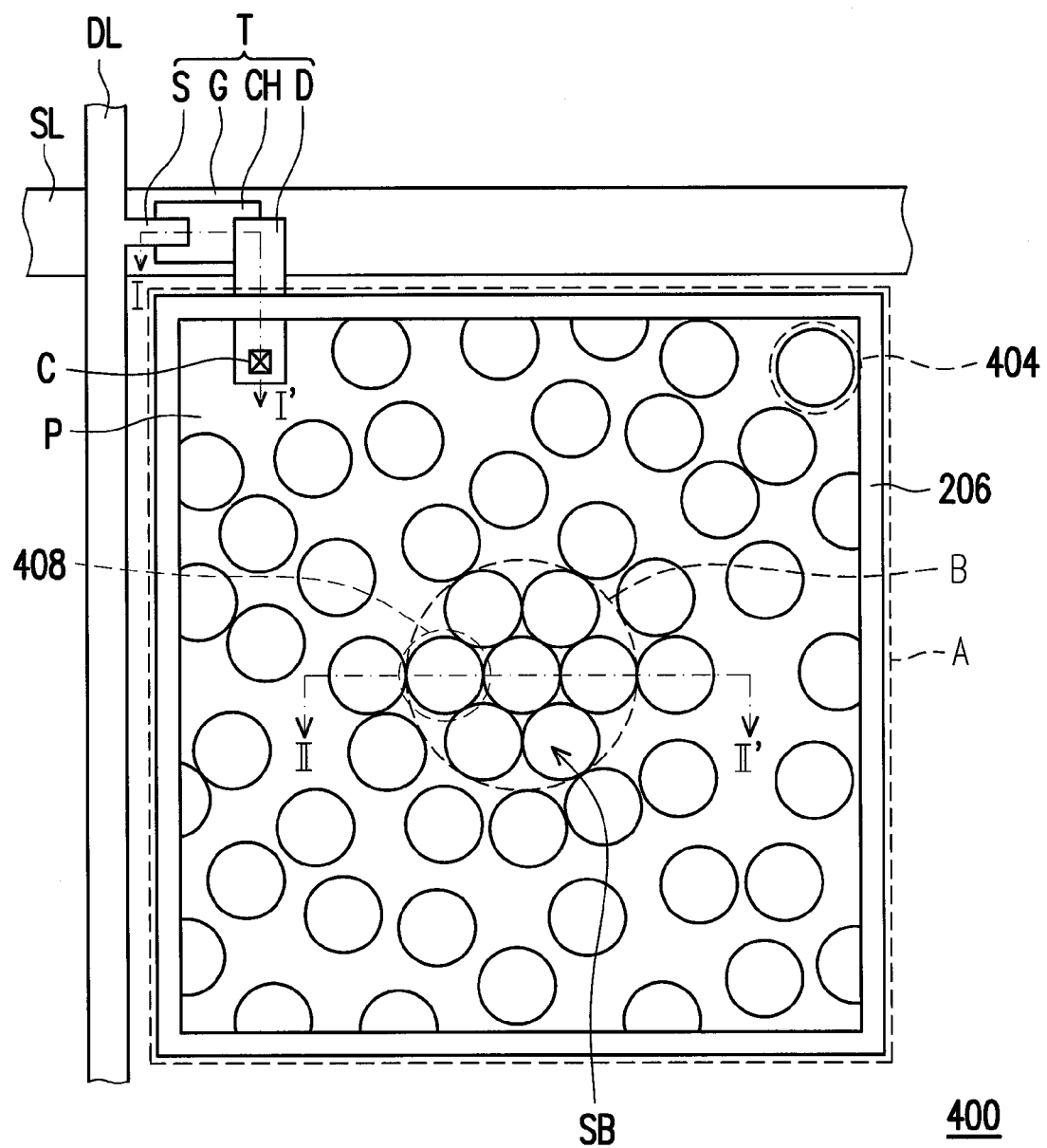
FIG. 8 is a schematic top view of a pixel structure according to yet another embodiment of the invention.
Figure 9:
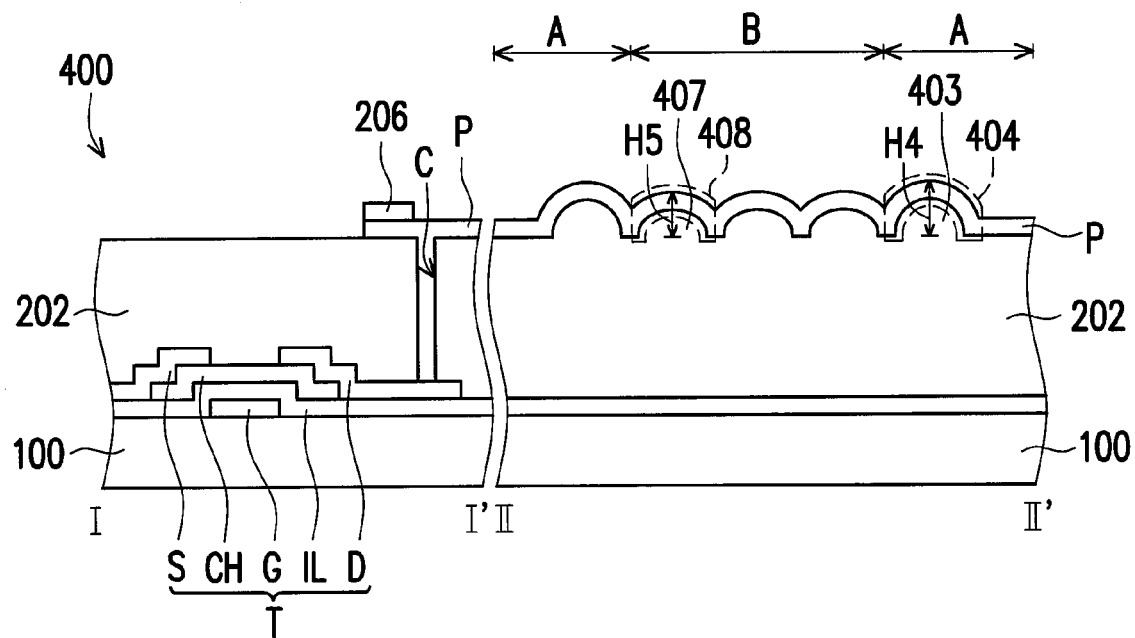
FIG. 9 is a schematic cross-sectional diagram along the lines I-I' and II-IP of FIG. 8.

FIG. 8 is a schematic cross-sectional diagram of a pixel structure according to another embodiment of the invention. FIG. 9 is a schematic cross-sectional diagram along the lines I-I' and II-II' of FIG. 8. The embodiment of FIG. 8 and FIG. 9 is similar to the embodiment of FIG. 2 and FIG. 3, and therefore the same components are represented by the same reference numerals and are not repeated herein.

Differences between the pixel structure 400 shown in FIG. 8 and FIG. 9 and the pixel structure 200 shown in FIG. 2 and FIG. 3 lie in that: the top portion of the covering layer 202 includes a plurality of bumps 403 and a plurality of bumps 407, the first region A of the reflective pixel electrode P includes a plurality of protruding structures 404, and the second region B of the reflective pixel electrode P includes a plurality of protruding structures 408. In particular, taking the lowest horizontal position of the top surface of the covering layer 202 as a base, a height H4 of each of the protruding structures 404 is greater than a height H5 of each of the protruding structures 408. In an embodiment, the ratio of the height H4 of each of the protruding structures 404 in the first region A to the height H5 of each of the protruding structures 408 in the second region B is 1.7:1 to 5:1.

As described above, in the case that the vertical projection area of each of the protruding structures on the covering layer is the same, a larger height of the protruding structures indicates a larger surface curvature of the protruding structures. In FIG. 9, the vertical projection area of each of the protruding structures 404 on the covering layer 202 is the same as the vertical projection area of each of the protruding structures 408 on the covering layer 202, and therefore when the height H4 of each of the protruding structures 404 is greater than the height H5 of each of the protruding structures 408, the surface curvature of each of the protruding structures 404 is greater than the surface curvature of each of the protruding structures 408. In this way, in the pixel structure 400 of the present embodiment, when light enters the reflective pixel electrode P, in comparison to the protruding structures 404 in the first region A, the protruding structures 408 in the second region B can provide a function similar to a planar surface, thereby increasing light reflectance.

It can be known from the embodiment of each of FIG. 8 and FIG. 9 that, the first region A of the reflective pixel electrode P includes the protruding structures 404, the second region B of the reflective pixel electrode P includes the protruding structures 408, the height H4 of each of the protruding structures 404 is greater than the height H5 of each of the protruding structures 408, the area occupied by the first region A is 50% to 70% of the total area of the reflective pixel electrode P, and the area occupied by the second region B is 30% to 50% of the total area of the reflective pixel electrode P. Therefore, when light enters the reflective pixel electrode P, the pixel structure 400 can have better reflection efficiency and reflection angle distribution. In this way, the display panel of the invention can have better display quality and wider viewing angle.

In the following, a plurality of experimental examples is used to explain that the pixel structure of the invention has better reflection efficiency and reflection angle distribution.

Figure 10:
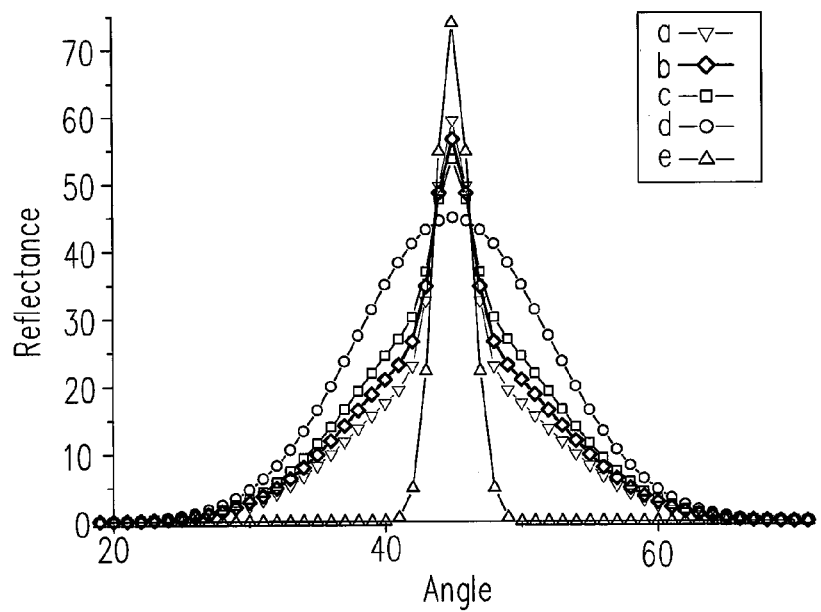
FIG. 10 is a curve diagram of the relationship between reflectance and angle of five different pixel structures according to an embodiment of the invention.

FIG. 10 is a curve diagram of the relationship between reflectance and angle of five different pixel structures according to an embodiment of the invention. Referring to FIG. 10, curves a to e represent the relationships between reflectance and angle of five pixel structures. In the present experimental example, a difference between the pixel structures represented by the curves a to e lies in that the configuration of the reflective pixel electrode is different. The other parts of the pixel structure are as described in each of the embodiments. In particular, the substrate is a glass substrate, the material of the covering layer is an organic material, the material of the reflective pixel electrode is aluminum, and the material of the fixed layer is indium tin oxide. Moreover, in the present experimental example, the reflectance is measured with a colorimeter instrument (model: CM-2500, made by Minolta).

In the pixel structure represented by the curve a, the reflective pixel electrode includes a first region having a protruding structure and a second region having a planar surface (as shown in FIGS. 2, 3, or FIG. 7). In particular, the height of the protruding structure is 1.86 μm, the area occupied by the first region is 50% of the total area of the reflective pixel electrode, and the area occupied by the second region is also 50% of the total area of the reflective pixel electrode.

In the pixel structure represented by the curve b, the reflective pixel electrode includes a first region having a protruding structure and a second region having a planar surface (as shown in FIGS. 2, 3, or FIG. 7). In particular, the height of the protruding structure is 1.86 μm, the area occupied by the first region is 60% of the total area of the reflective pixel electrode, and the area occupied by the second region is 40% of the total area of the reflective pixel electrode.

In the pixel structure represented by the curve c, the reflective pixel electrode includes a first region having a protruding structure and a second region having a planar surface (as shown in FIGS. 2, 3, or FIG. 7). In particular, the height of the protruding structure is 1.86 μm, the area occupied by the first region is 70% of the total area of the reflective pixel electrode, and the area occupied by the second region is 30% of the total area of the reflective pixel electrode.

In the pixel structure represented by the curve d, protruding structures are distributed throughout the entire reflective pixel electrode. In particular, the height of each of the protruding structures is 1.86 μm.

In the pixel structure represented by the curve e, the entire surface of the reflective pixel electrode is planar.

It can be known from FIG. 10 that, compared to the pixel structure represented by the curve d, the pixel structure represented by each of the curves a, b, and c has better reflectance. Specifically, compared to the pixel structure represented by the curve d, the reflectance of the pixel structure represented by each of the curves a, b, and c is increased by about 20% to 30%. Moreover, compared to the pixel structure represented by the curve e, the pixel structure represented by each of the curves a, b, and c has a wider reflection angle distribution. In other words, by having both protruding structures and a planar surface in the reflective pixel electrode, the pixel structure represented by each of the curves a, b, and c has better reflection efficiency and reflection angle distribution.

Figure 11:
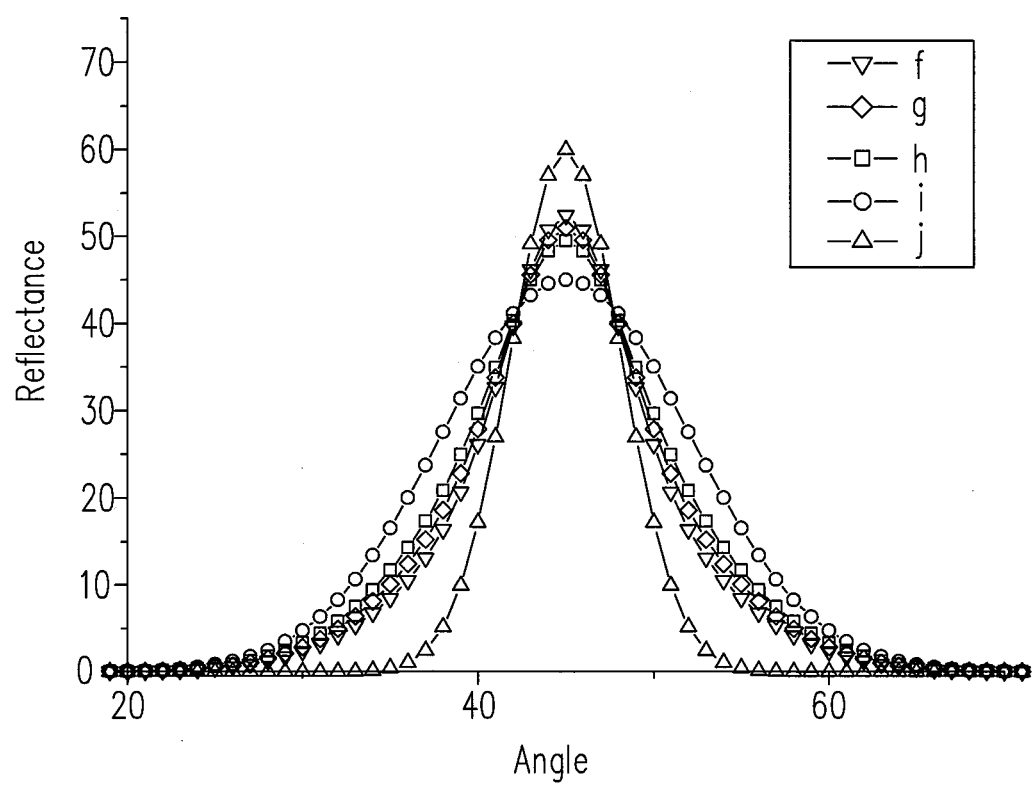
FIG. 11 is a curve diagram of the relationship between reflectance and angle of five different pixel structures according to yet another embodiment of the invention.

FIG. 11 is a curve diagram of the relationship between reflectance and angle of five different pixel structures according to another embodiment of the invention. Referring to FIG. 11, curves f to j represent the relationships between reflectance and angle of five pixel structures. In the present experimental example, a difference between the pixel structures represented by the curves f to j lies in that the configuration of the reflective pixel electrode is different. The rest of the pixel structure is as described in each of the embodiments. In particular, the substrate is a glass substrate, the material of the covering layer is an organic material, the material of the reflective pixel electrode is aluminum, and the material of the fixed layer is indium tin oxide. Moreover, in the present experimental example, the reflectance is measured with a colorimeter instrument (model: CM-2500, made by Minolta).

In the pixel structure represented by the curve f, the reflective pixel electrode includes a first region having a plurality of protruding structures and a second region having a plurality of protruding structures (as shown in FIGS. 8 and 9). In particular, the height of each of the protruding structures in the first region is 1.86 μm, the height of each of the protruding structures in the second region is 1.41 μm, the area occupied by the first region is 50% of the total area of the reflective pixel electrode, and the area occupied by the second region is 50% of the total area of the reflective pixel electrode.

In the pixel structure represented by the curve g, the reflective pixel electrode includes a first region having a plurality of protruding structures and a second region having a plurality of protruding structures (as shown in FIGS. 8 and 9). In particular, the height of each of the protruding structures in the first region is 1.86 µm, the height of each of the protruding structures in the second region is 1.41 µm, the area occupied by the first region is 60% of the total area of the reflective pixel electrode, and the area occupied by the second region is 40% of the total area of the reflective pixel electrode.

In the pixel structure represented by the curve h, the reflective pixel electrode includes a first region having a plurality of protruding structures and a second region having a plurality of protruding structures (as shown in FIGS. 8 and 9). In particular, the height of each of the protruding structures in the first region is 1.86 µm, the height of each of the protruding structures in the second region is 1.41 µm, the area occupied by the first region is 70% of the total area of the reflective pixel electrode, and the area occupied by the second region is 30% of the total area of the reflective pixel electrode.

In the pixel structure represented by the curve i, protruding structures are distributed throughout the entire reflective pixel electrode. In particular, the height of each of the protruding structures is 1.86 µm.

In the pixel structure represented by the curve j, protruding structures are distributed throughout the entire reflective pixel electrode. In particular, the height of each of the protruding structures is 1.41 µm.

It can be known from FIG. 11 that, compared to the pixel structure represented by the curve i, the pixel structure represented by each of the curves f, g, and h has better reflectance. Specifically, compared to the pixel structure represented by the curve i, the reflectance of the pixel structure represented by each of the curves f, g, and h is increased by about 10% to 15%. Moreover, compared to the pixel structure represented by the curve j, the pixel structure represented by each of the curves f, g, and h has a wider reflection angle distribution. In other words, by including two types of protruding structures having different heights in the reflective pixel electrode at the same time, i.e., two types of protruding structures having different curvatures, the pixel structure represented by each of the curves f, g, and h has better reflection efficiency and reflection angle distribution.

Based on the above, in the pixel structure provided in the embodiments, a reflective pixel electrode includes a first region having a protruding structure and a second region having a planar surface. Alternately, the reflective pixel electrode includes a first region and a second region respectively having a plurality of protruding structures. In particular, the height of each of the protruding structures in the first region is greater than the height of each of the protruding structures in the second region, the area occupied by the first region is 50% to 70% of the total area of the reflective pixel electrode, and the area occupied by the second region is 30% to 50% of the total area of the reflective pixel electrode. As a result, the pixel structure of the invention can have better reflection efficiency and reflection angle distribution. In this way, the display panel of the invention can have better display quality and wider viewing angle.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A pixel structure, comprising:
   a scan line and a data line;
   an active device electrically connected with the scan line and the data line;
   a covering layer covering the scan line, the data line, and the active device; and
   a reflective pixel electrode disposed on the covering layer and electrically connected with the active device, the reflective pixel electrode comprising a first reflective region and a second reflective region, the first reflective region having a plurality of first protruding structures and the second reflective region having a planar surface,
   wherein an area occupied by the first reflective region is 50% to 70% of a total area of the reflective pixel electrode and an area occupied by the second reflective region is 30% to 50% of the total area of the reflective pixel electrode.

2. The pixel structure of claim 1, wherein the second reflective region comprises a second protruding structure and a top surface of the second protruding structure is the planar surface.

3. The pixel structure of claim 1, wherein a height of each of the first protruding structures in the first reflective region is substantially greater than or equal to a height of the planar surface.

4. The pixel structure of claim 1, wherein a shape of the second reflective region comprises a circle, an ellipse, a rectangle, a triangle, a rhombus, a trapezoid, or a cross.

5. The pixel structure of claim 1, wherein the second reflective region is located in a central region or any corner region of the reflective pixel electrode.

6. The pixel structure of claim 1, further comprising a fixed layer disposed on the reflective pixel electrode and surrounding a periphery of the reflective pixel electrode.

7. A pixel structure, comprising:
   a scan line and a data line;
   an active device electrically connected with the scan line and the data line;
   a covering layer covering the scan line, the data line, and the active device; and
   a reflective pixel electrode disposed on the covering layer and electrically connected with the active device, the reflective pixel electrode comprising a first reflective region and a second reflective region, the first reflective region having a plurality of first protruding structures and the second reflective region having a plurality of second protruding structures, wherein a height of each of the first protruding structures in the first reflective region is greater than or equal to a height of each of the second protruding structures in the second reflective region,
   wherein an area occupied by the first reflective region is 50% to 70% of a total area of the reflective pixel electrode and an area occupied by the second reflective region is 30% to 50% of the total area of the reflective pixel electrode.

8. The pixel structure of claim 7, wherein a ratio of the height of each of the first protruding structures in the first reflective region to the height of each of the second protruding structures in the second reflective region is 1.7:1 to 5:1.

9. The pixel structure of claim 7, wherein a shape of the second reflective region comprises a circle, an ellipse, a rectangle, a triangle, a rhombus, a trapezoid, or a cross.

10. The pixel structure of claim 7, wherein the second reflective region is located in a central region or any corner region of the reflective pixel electrode.

11. The pixel structure of claim 7, further comprising a fixed layer disposed on the reflective pixel electrode and surrounding a periphery of the reflective pixel electrode.

\* \* \* \* \*